United States Patent
Du et al.

(10) Patent No.: US 11,837,144 B2
(45) Date of Patent: Dec. 5, 2023

(54) DISPLAYING BASE PLATE AND DISPLAYING DEVICE

(71) Applicants: Chengdu BOE Optoelectronics Technology Co., Ltd., Sichuan (CN); BOE Technology Group Co., Ltd., Beijing (CN)

(72) Inventors: Lili Du, Beijing (CN); Yue Long, Beijing (CN); Pinchao Gu, Beijing (CN); Yuanyou Qiu, Beijing (CN); Qiwei Wang, Beijing (CN); Tianyi Cheng, Beijing (CN)

(73) Assignees: Chengdu BOE Optoelectronics Technology Co., Ltd., Sichuan (CN); BOE TECHNOLOGY GROUP CO., LTD., Beijing (CN)

( * ) Notice: Subject to any disclaimer, the term of this patent is extended or adjusted under 35 U.S.C. 154(b) by 177 days.

(21) Appl. No.: 17/299,008

(22) PCT Filed: Sep. 30, 2020

(86) PCT No.: PCT/CN2020/119166
§ 371 (c)(1),
(2) Date: Jun. 2, 2021

(87) PCT Pub. No.: WO2022/067603
PCT Pub. Date: Apr. 7, 2022

(65) Prior Publication Data
US 2022/0319386 A1 Oct. 6, 2022

(51) Int. Cl.
*G09G 3/20* (2006.01)
*G06F 1/16* (2006.01)

(52) U.S. Cl.
CPC ......... *G09G 3/2092* (2013.01); *G06F 1/1686* (2013.01); *G09G 2300/0421* (2013.01); *G09G 2310/0267* (2013.01)

(58) Field of Classification Search
None
See application file for complete search history.

(56) References Cited

U.S. PATENT DOCUMENTS

| | | | |
|---|---|---|---|
| 2021/0335913 A1 | 10/2021 | Zhang et al. | |
| 2021/0360194 A1 | 11/2021 | Zhao et al. | |
| 2021/0384266 A1* | 12/2021 | Zhao | H10K 59/121 |

FOREIGN PATENT DOCUMENTS

| | | |
|---|---|---|
| CN | 110098238 A | 8/2019 |
| CN | 110491917 A | 11/2019 |

(Continued)

*Primary Examiner* — Ifedayo B Iluyomade
(74) *Attorney, Agent, or Firm* — WHDA, LLP

(57) ABSTRACT

The present application provides a displaying base plate and a displaying device, wherein the displaying base plate includes a transparent displaying region and an effective displaying region, the transparent displaying region includes a plurality of scanning lines, each of the scanning lines includes one or more first light emitting regions, a driving electrode of each of the first light emitting regions is connected to a corresponding driving circuit via a transparent trace, the transparent traces connected to the driving electrodes of a same one instance of the scanning lines are located in a same one layer, the plurality of scanning lines include at least a pair of neighboring first scanning line and second scanning line, and the transparent traces connected to the driving electrodes of the first scanning line and the transparent traces connected to the driving electrodes of the second scanning line are located in different layers.

19 Claims, 5 Drawing Sheets

(56) References Cited

FOREIGN PATENT DOCUMENTS

CN 110491918 A 11/2019
KR 10-2018-0002274 A 1/2018

* cited by examiner

DISPLAYING BASE PLATE AND DISPLAYING DEVICE

TECHNICAL FIELD

The present disclosure relates to the technical field of displaying, and particularly relates to a displaying base plate and a displaying device.

BACKGROUND

With the increasingly more demands on visual effect by consumers, ultra-narrow boundary frames or even full-screen displaying have become the development trend of display products. With the continuous increasing of the screen-to-body ratio of many high-end mobile phones, full screen has become the very trend currently. The bottle-neck problem to be solved in the design of full screens is how to deal with the front-facing camera. In order to reach a higher screen-to-body ratio, bang screens, water-drop screens, hole screens and so on have gradually emerged. Although such forms of full screen increase the screen-to-body ratio, the appearances and the aesthetics of the mobile phones are deteriorated very much. Therefore, considering comprehensive, a under-screen camera is the optimum form of full screens.

The under-screen camera refers to that the front-facing camera is provided at a transparent displaying region, when the front-facing camera is not being used, the transparent displaying region over the camera can normally display an image, and when the front-facing camera is being used, the light ray of the shot object can transmit the transparent displaying region and enter the camera. Therefore, the under-screen camera does not require a camera hole, and thus can realize the true effect of full-screen displaying.

In the related art, the transparent displaying region comprises a plurality of light emitting regions, and the driving electrode of each of the light emitting regions is connected to a driving circuit via a transparent trace. When the transparent displaying region is large or the distribution density of the light emitting regions is high, the quantity of the transparent traces will be very enormous. How to place the transparent traces of an enormous quantity into a limited space is a technical problem required to be solved urgently in the art.

SUMMARY

The present disclosure provides a displaying base plate and a displaying device, to place transparent traces of an enormous quantity into a limited space.

In order to solve the above problems, the present disclosure discloses a displaying base plate, wherein the displaying base plate comprises a transparent displaying region and an effective displaying region, the transparent displaying region comprises a plurality of scanning lines, each of the scanning lines comprises one or more first light emitting regions, a driving electrode of each of the first light emitting regions is connected to a corresponding driving circuit via a transparent trace, the transparent traces connected to the driving electrodes of a same one instance of the scanning lines are located in a same one layer, the plurality of scanning lines include at least a pair of neighboring first scanning line and second scanning line, and the transparent traces connected to the driving electrodes of the first scanning line and the transparent traces connected to the driving electrodes of the second scanning line are located in different layers.

In an optional implementation, the transparent traces connected to the driving electrodes of any two neighboring instances of the scanning lines are located in different layers.

In an optional implementation, the displaying base plate comprises: a substrate base plate, and a first transparent-trace layer, a first insulating layer and a second transparent-trace layer that are provided in stack on one side of the substrate base plate, the first transparent-trace layer is provided closer to the substrate base plate, and orthographic projections on the substrate base plate of at least one transparent trace in the first transparent-trace layer and at least one transparent trace in the second transparent-trace layer partially overlap.

In an optional implementation, the orthographic projections on the substrate base plate of the at least one transparent trace in the first transparent-trace layer and the at least one transparent trace in the second transparent-trace layer intersect; and/or line segments extending in a first direction of the orthographic projections on the substrate base plate of the at least one transparent trace in the first transparent-trace layer and the at least one transparent trace in the second transparent-trace layer partially overlap, wherein the first direction is a direction of extension of the scanning lines.

In an optional implementation, the displaying base plate further comprises: a second insulating layer and a third transparent-trace layer that are provided in stack on one side of the second transparent-trace layer that is further away from the substrate base plate, the second insulating layer is provided closer to the second transparent-trace layer, and orthographic projections on the substrate base plate of at least one transparent trace in the third transparent-trace layer and at least one transparent trace in the second transparent-trace layer partially overlap.

In an optional implementation, the orthographic projections on the substrate base plate of the at least one transparent trace in the third transparent-trace layer and the at least one transparent trace in the second transparent-trace layer intersect; and/or line segments extending in a first direction of the orthographic projections on the substrate base plate of the at least one transparent trace in the third transparent-trace layer and the at least one transparent trace in the second transparent-trace layer partially overlap, wherein the first direction is a direction of extension of the scanning lines.

In an optional implementation, orthographic projections on the substrate base plate of at least one transparent trace in the third transparent-trace layer and at least one transparent trace in the first transparent-trace layer partially overlap.

In an optional implementation, the orthographic projections on the substrate base plate of the at least one transparent trace in the third transparent-trace layer and the at least one transparent trace in the first transparent-trace layer intersect; and/or line segments extending in a first direction of the orthographic projections on the substrate base plate of the at least one transparent trace in the third transparent-trace layer and the at least one transparent trace in the first transparent-trace layer partially overlap, wherein the first direction is a direction of extension of the scanning lines.

In an optional implementation, a quantity of the scanning lines in the transparent displaying region is N, the transparent traces connected to the driving electrodes of an n-th scanning line include a first transparent trace and a second transparent trace, the first transparent trace comprises a first extension part extending in a first direction, an orthographic projection of the first extension part on a first plane is located between the n-th scanning line and an (n−1)-th scanning line, the second transparent trace comprises a second extension part extending in the first direction, and an orthographic projection of the second extension part on the first plane is located between the (n−1)-th scanning line and an (n−2)-th scanning line;

wherein the first direction is a direction of extension of the scanning lines, the first plane is a plane where all of the first light emitting regions are located, and $2 \leq n \leq N$.

In an optional implementation, the transparent traces connected to the driving electrodes of the n-th scanning line further include a third transparent trace, the third transparent trace comprises a third extension part extending in the first direction, and an orthographic projection of the third extension part on the first plane is located between the (n−2)-th scanning line and an (n−3)-th scanning line, wherein $3 \leq n \leq N$.

In an optional implementation, the transparent traces connected to the driving electrodes of the n-th scanning line and the transparent traces connected to the driving electrodes of the (n−2)-th scanning line are located in different layers.

In an optional implementation, a quantity of the scanning lines in the transparent displaying region is N, the transparent traces connected to the driving electrodes of an n-th scanning line include a fourth transparent trace and a fifth transparent trace, the fourth transparent trace comprises a fourth extension part extending in a first direction, an orthographic projection of the fourth extension part on a first plane is located between the n-th scanning line and an (n+1)-th scanning line, the fifth transparent trace comprises a fifth extension part extending in the first direction, and an orthographic projection of the fifth extension part on the first plane is located between the (n+1)-th scanning line and an (n+2)-th scanning line;

wherein the first direction is a direction of extension of the scanning lines, the first plane is a plane where all of the first light emitting regions are located, and $1 \leq n \leq N-1$.

In an optional implementation, the transparent traces connected to the driving electrodes of the n-th scanning line further include a sixth transparent trace, the sixth transparent trace comprises a sixth extension part extending in the first direction, and an orthographic projection of the sixth extension part on the first plane is located between the (n+2)-th scanning line and an (n+3)-th scanning line, wherein $1 \leq n \leq N-2$.

In an optional implementation, the transparent traces connected to the driving electrodes of the n-th scanning line and the transparent traces connected to the driving electrodes of the (n+2)-th scanning line are located in different layers.

In an optional implementation, the displaying base plate further comprises a boundary-frame region provided at a periphery of the transparent displaying region and of the effective displaying region, and the driving circuits are provided at the boundary-frame region.

In an optional implementation, the effective displaying region comprises a plurality of second light emitting regions, and a distribution density of the first light emitting regions and a distribution density of the second light emitting regions are equal.

In an optional implementation, an area of the first light emitting regions is less than or equal to an area of the second light emitting regions.

In an optional implementation, the effective displaying region comprises a plurality of second light emitting regions, and a distribution density of the first light emitting regions is less than a distribution density of the second light emitting regions.

In an optional implementation, an area of the first light emitting regions is less than or equal to an area of the second light emitting regions.

In order to solve the above problems, the present disclosure further discloses a displaying device, wherein the displaying device comprises a camera and the displaying base plate according to any one of the above embodiments, and an orthographic projection of the camera on the displaying base plate is located within the transparent displaying region.

As compared with the prior art, the present disclosure has the following advantages:

The technical solutions of the present application provide a displaying base plate and a displaying device, wherein the displaying base plate comprises a transparent displaying region and an effective displaying region, the transparent displaying region comprises a plurality of scanning lines, each of the scanning lines comprises one or more first light emitting regions, a driving electrode of each of the first light emitting regions is connected to a corresponding driving circuit via a transparent trace, the transparent traces connected to the driving electrodes of a same one instance of the scanning lines are located in a same one layer, the plurality of scanning lines include at least a pair of neighboring first scanning line and second scanning line, and the transparent traces connected to the driving electrodes of the first scanning line and the transparent traces connected to the driving electrodes of the second scanning line are located in different layers. The technical solutions of the present application, by providing the transparent traces connected to the driving electrodes of the first scanning line and the transparent traces connected to the driving electrodes of the second scanning line in the different layers, can enlarge the wiring room of the transparent traces connected to the driving electrodes of the first scanning line and the transparent traces connected to the driving electrodes of the second scanning line, thereby realizing placing transparent traces of an enormous quantity into a limited space.

The above description is merely a summary of the technical solutions of the present disclosure. In order to more clearly know the elements of the present disclosure to enable the implementation according to the contents of the description, and in order to make the above and other purposes, features and advantages of the present disclosure more apparent and understandable, the particular embodiments of the present disclosure are provided below.

BRIEF DESCRIPTION OF THE DRAWINGS

In order to more clearly illustrate the technical solutions of the embodiments of the present disclosure or the prior art, the figures that are required to describe the embodiments or the prior art will be briefly introduced below. Apparently, the figures that are described below are embodiments of the present disclosure, and a person skilled in the art can obtain other figures according to these figures without paying creative work.

DETAILED DESCRIPTION

In order to make the objects, the technical solutions and the advantages of the embodiments of the present disclosure clearer, the technical solutions of the embodiments of the present disclosure will be clearly and completely described below with reference to the drawings of the embodiments of the present disclosure. Apparently, the described embodiments are merely certain embodiments of the present disclosure, rather than all of the embodiments. All of the other embodiments that a person skilled in the art obtains on the basis of the embodiments of the present disclosure without paying creative work fall within the protection scope of the present disclosure.

Figure 1:
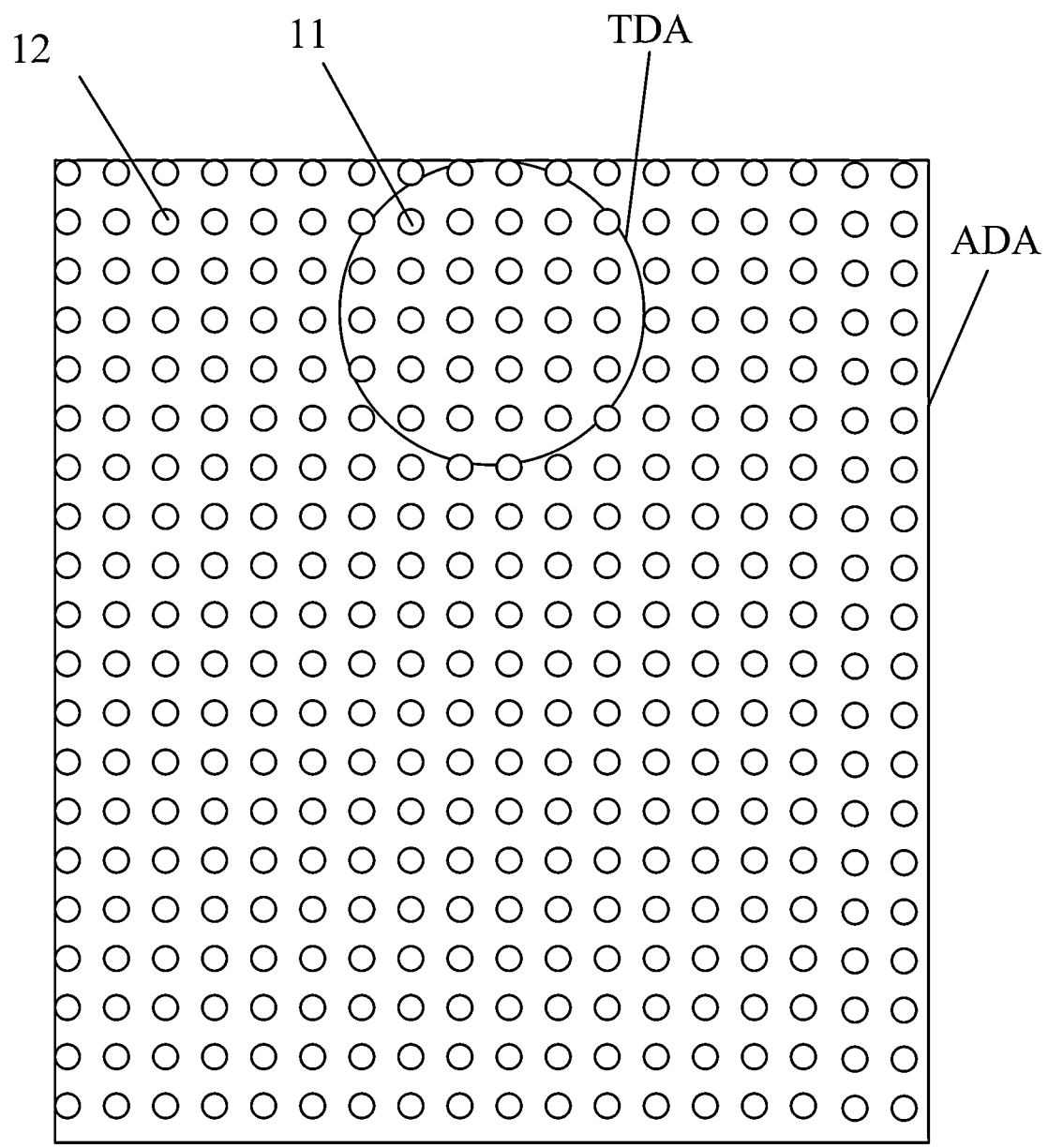
FIG. 1 shows a schematic planar structural diagram of the displaying base plate according to an embodiment of the present application.
Figure 2:
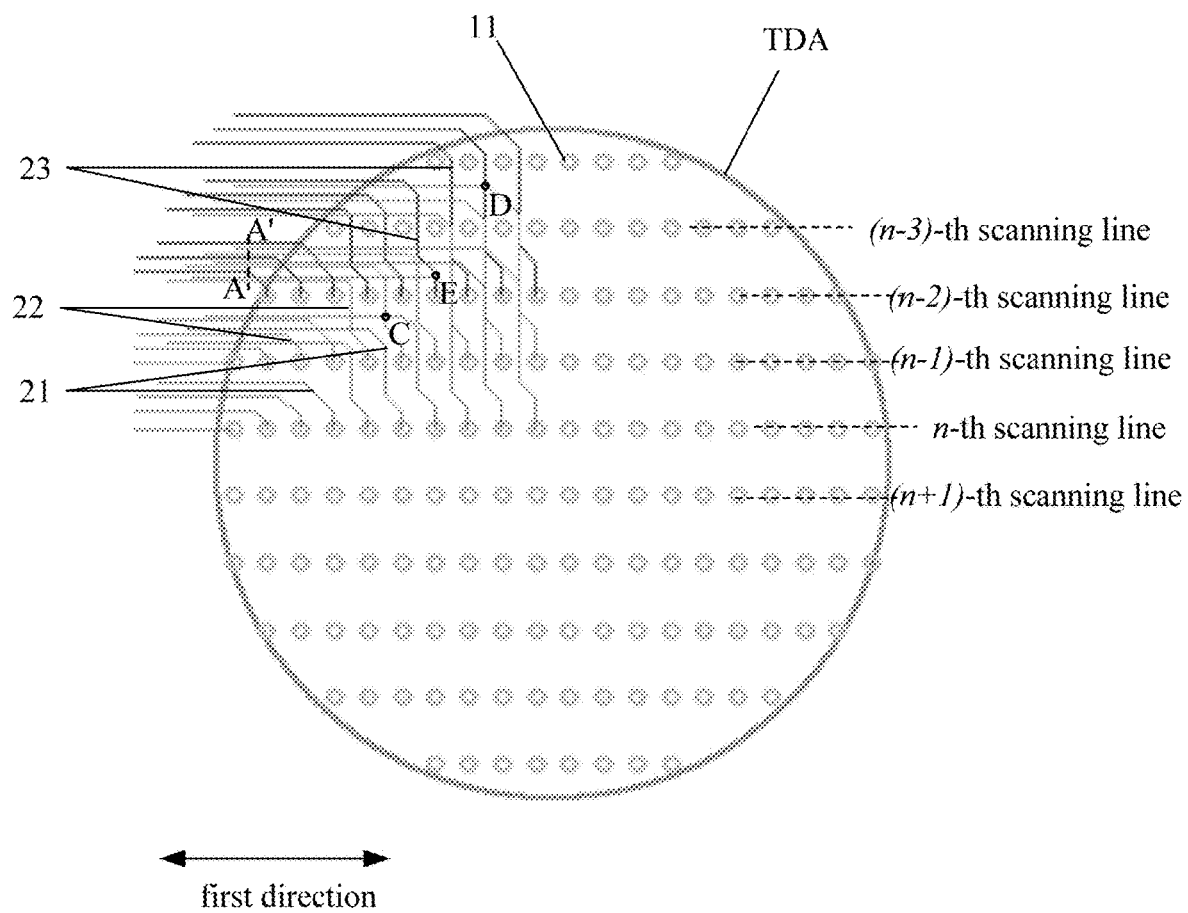
FIG. 2 shows a schematic planar structural diagram of the transparent displaying region according to an embodiment of the present application.

An embodiment of the present application provides a displaying base plate. Referring to FIG. 1, FIG. 1 shows a schematic planar structural diagram of a displaying base plate. The displaying base plate comprises a transparent displaying region TDA and an effective displaying region ADA. Referring to FIG. 2, FIG. 2 shows a schematic planar structural diagram of the transparent displaying region. The transparent displaying region TDA comprises a plurality of scanning lines, each of the scanning lines comprises one or more first light emitting regions 11, a driving electrode of each of the first light emitting regions is connected to a corresponding driving circuit via a transparent trace, the transparent traces connected to the driving electrodes of the same one scanning line are located in the same one layer, the plurality of scanning lines include at least one pair of neighboring first scanning line and second scanning line, and the transparent traces connected to the driving electrodes of the first scanning line and the transparent traces connected to the driving electrodes of the second scanning line are located in different layers.

The material of the transparent traces may be a transparent electrically conductive material, such as ITO.

In a particular implementation, the transparent traces connected to the driving electrodes of the same one scanning line of the transparent displaying region TDA are arranged in the same one layer. The transparent displaying region TDA may comprise one or more pairs of neighboring first scanning lines and second scanning lines, and the transparent traces connected to the driving electrodes of the first scanning line and the transparent traces connected to the driving electrodes of the second scanning line are located in different layers.

Figure 4:
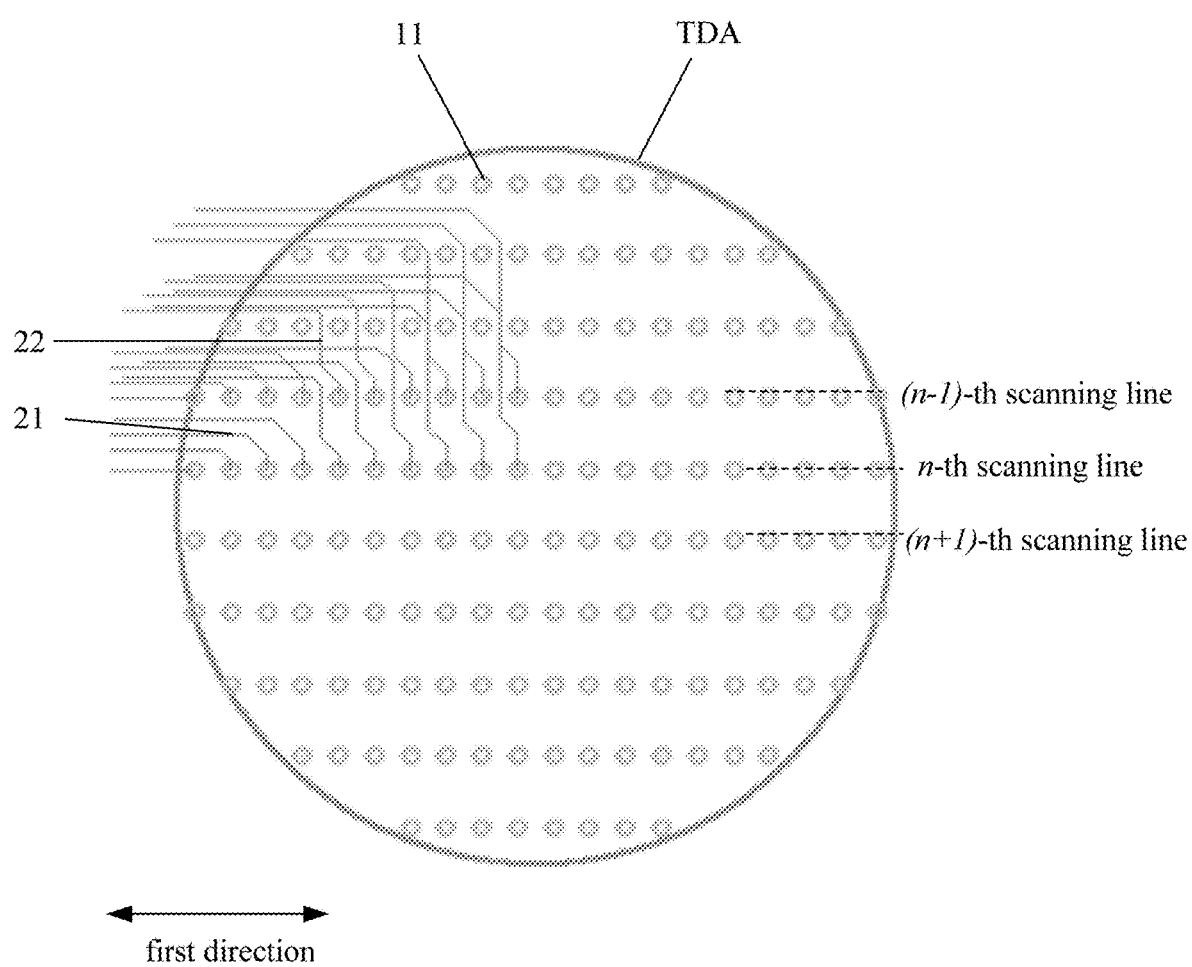
FIG. 4 shows a schematic structural diagram of a first layout of the transparent traces according to an embodiment of the present application.

Referring to FIGS. 2 and 4, the transparent traces 21 connected to the driving electrodes of the n-th scanning line are located in the same one layer, the transparent traces 22 connected to the driving electrodes of the (n−1)-th scanning line are arranged in the same one layer, and the transparent traces 23 connected to the driving electrodes of the (n−2)-th scanning line are arranged in the same one layer.

When the transparent displaying region TDA is large or the density of the first light emitting regions 11 is high, it is assumed that the quantity of the scanning lines in the transparent displaying region is N, the first scanning line is the n-th scanning line, and the second scanning line adjacent to the first scanning line is the (n−1)-th scanning line. Because the transparent traces 21 connected to the driving electrodes of the n-th scanning line have a large quantity, and thus cannot be totally placed in the scanning-line gap formed between the n-th scanning line and the neighboring scanning line, for example the (n−1)-th scanning line, some of the transparent traces 21 connected to the driving electrodes of the n-th scanning line may pass through the (n−1)-th scanning line, and, along the scanning-line gap formed between the (n−1)-th scanning line and the (n−2)-th scanning line, be connected to the corresponding driving circuit. Therefore, in order to prevent short circuit between the transparent traces 21 connected to the driving electrodes of the n-th scanning line and the transparent traces 22 connected to the driving electrodes of the (n−1)-th scanning line, the transparent traces 21 connected to the driving electrodes of the n-th scanning line (the first scanning line) and the transparent traces 22 connected to the driving electrodes of the (n−1)-th scanning line (the second scanning line) may be arranged in two different film layers.

It should be noted that the first scanning line and the second scanning line are relative. For example, when the n-th scanning line is the first scanning line, the neighboring (n−1)-th scanning line is the second scanning line, and when the n-th scanning line is the second scanning line, the neighboring (n−1)-th scanning line is the first scanning line.

The displaying base plate according to the present embodiment, by providing the transparent traces connected to the driving electrodes of the first scanning line and the transparent traces connected to the driving electrodes of the second scanning line in the different layers, can enlarge the wiring room of the transparent traces connected to the driving electrodes of the first scanning line and the transparent traces connected to the driving electrodes of the second scanning line, thereby realizing placing transparent traces of an enormous quantity into a limited space, preventing short circuit between transparent traces in the same one layer, and reducing the difficulty in the structural design and process.

In an optional implementation, the transparent traces connected to the driving electrodes of any two neighboring scanning lines are located in different layers.

In practical applications, the structure of the film layers of the transparent traces connected to the driving electrodes of a plurality of scanning lines may have multiple implementations. In an implementation, assuming that the transparent traces connected to the driving electrodes of two neighboring scanning lines (for example, the first scanning line and the second scanning line) are individually located in a first film layer and a second film layer, the transparent traces connected to the driving electrodes of the plurality of scanning lines may be arranged alternately in the first film layer and the second film layer. In another implementation, the plurality of scanning lines may also include a third scanning line, the third scanning line is closer to the first scanning line or the second scanning line, the transparent traces connected to the driving electrodes of the first scanning line may be located in the first film layer, the transparent traces connected to the driving electrodes of the second scanning line may be located in the second film layer, the transparent traces connected to the driving electrodes of the third scanning line may be located in a third film layer, and the transparent traces connected to the driving electrodes of the plurality of scanning lines may be arranged periodically in the order of the first film layer, the second film layer and the third film layer. In yet another implementation, the transparent traces connected to the driving electrodes of each of the scanning lines may be located in different film layers.

Referring to FIG. 2, when the transparent displaying region TDA is large or the density of the first light emitting regions 11 is high, because the transparent traces 21 connected to the driving electrodes of the n-th scanning line have a large quantity, and thus cannot be totally placed in the scanning-line gap formed between the n-th scanning line and the neighboring scanning line, for example the (n−1)-th scanning line, and the scanning-line gap formed between the (n−1)-th scanning line and the (n−2)-th scanning line, some of the transparent traces 21 connected to the driving electrodes of the n-th scanning line may further pass through the (n−2)-th scanning line, and, along the scanning-line gap formed between the (n−2)-th scanning line and the (n−3)-th scanning line, be connected to the corresponding driving circuit. Therefore, in order to prevent short circuit between the transparent traces, the transparent traces 21 connected to the driving electrodes of the n-th scanning line, the transparent traces 22 connected to the driving electrodes of the (n−1)-th scanning line and the transparent traces 23 connected to the driving electrodes of the (n−2)-th scanning line may be arranged in three different film layers.

In a particular implementation, when the transparent traces connected to the driving electrodes of one scanning line (for example, the n-th scanning line) are distributed in three scanning-line gaps (three scanning-line gaps formed by four scanning lines), in order to prevent short circuit between the transparent traces, the transparent traces connected to the driving electrodes of three neighboring scanning lines may be arranged in three different film layers. For example, as in FIG. 2, the transparent traces corresponding to the n-th scanning line, the transparent traces corresponding to the (n−1)-th scanning line and the transparent traces corresponding to the (n−2)-th scanning line are arranged in different film layers.

In the same manner, when the transparent traces connected to the driving electrodes of one scanning line are distributed in four scanning-line gaps (four scanning-line gaps formed by five scanning lines), in order to prevent short circuit between the transparent traces, the transparent traces connected to the driving electrodes of four neighboring scanning lines may be arranged in four different film layers. The rest may be done in the same manner.

Figure 3:
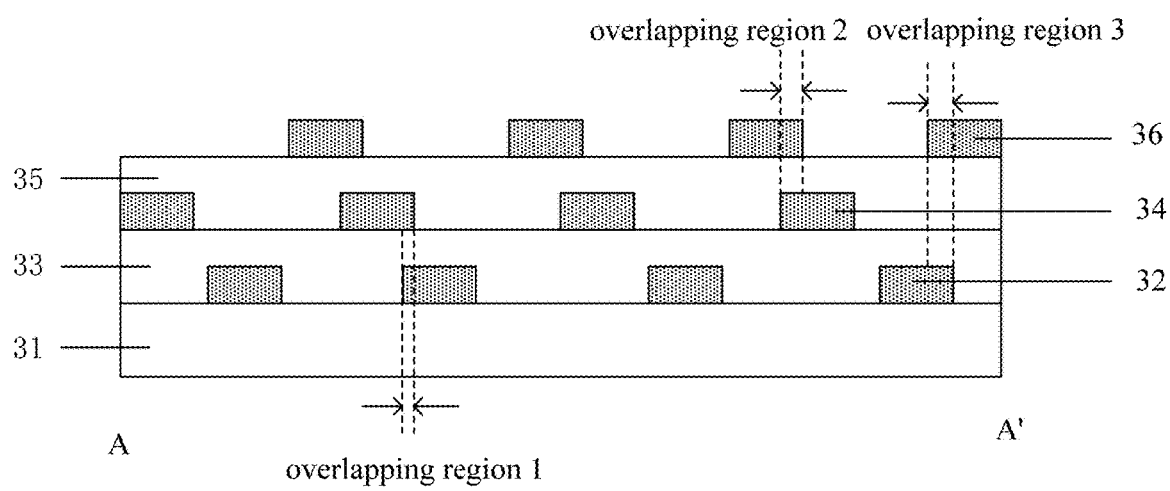
FIG. 3 shows a schematic sectional structural diagram of the displaying base plate according to an embodiment of the present application.

In order to reduce the formation of a coupling capacitance between the transparent traces in the different layers to the largest extent, in an optional implementation, referring to FIG. 3, FIG. 3 shows a schematic structural diagram along the section AA' of the displaying base plate shown in FIG. 2. The displaying base plate may comprise: a substrate base plate 31, and a first transparent-trace layer 32, a first insulating layer 33 and a second transparent-trace layer 34 that are provided in stack on one side of the substrate base plate 31, the first transparent-trace layer 32 is provided closer to the substrate base plate 31, and the orthographic projections on the substrate base plate 31 of at least one transparent trace in the first transparent-trace layer 32 and at least one transparent trace in the second transparent-trace layer 34 partially overlap.

In a particular implementation, the orthographic projections on the substrate base plate 31 of the at least one transparent trace in the first transparent-trace layer 32 and the at least one transparent trace in the second transparent-trace layer 34 intersect; and/or, line segments extending in a first direction of the orthographic projections on the substrate base plate 31 of the at least one transparent trace in the first transparent-trace layer 32 and the at least one transparent trace in the second transparent-trace layer 34 partially overlap, wherein the first direction is the direction of extension of the scanning lines.

Assuming that the transparent traces 21 are located in the first transparent-trace layer 32, and the transparent traces 22 are located in the second transparent-trace layer 34, then the overlapping part between the orthographic projection on the substrate base plate 31 of at least one transparent trace in the first transparent-trace layer 32 and the orthographic projection on the substrate base plate 31 of at least one transparent trace in the second transparent-trace layer 34 may be located at the position where they intersect, for example, the intersection point C in FIG. 2, and may also be located in the line segments extending in the first direction of them, for example, the overlapping region 1 shown in FIG. 3.

It should be noted that the orthographic projections on the substrate base plate 31 of the at least one transparent trace in the first transparent-trace layer 32 and the at least one transparent trace in the second transparent-trace layer 34 may also not overlap. For example, as in FIG. 2, the orthographic projections on the substrate base plate 31 of the transparent traces 21 located between the n-th scanning line and the (n−1)-th scanning line and the transparent traces 22 located between the (n−2)-th scanning line and the (n−3)-th scanning line do not overlap.

Optionally, referring to FIG. 3, the displaying base plate may further comprise: a second insulating layer 35 and a third transparent-trace layer 36 that are provided in stack on one side of the second transparent-trace layer 34 that is further away from the substrate base plate 31, the second insulating layer 35 is provided closer to the second transparent-trace layer 34, and the orthographic projections on the substrate base plate 31 of at least one transparent trace in the third transparent-trace layer 36 and at least one transparent trace in the second transparent-trace layer 34 partially overlap.

In a particular implementation, the orthographic projections on the substrate base plate 31 of the at least one transparent trace in the third transparent-trace layer 36 and the at least one transparent trace in the second transparent-trace layer 34 intersect; and/or line segments extending in a first direction of the orthographic projections on the substrate base plate 31 of the at least one transparent trace in the third transparent-trace layer 36 and the at least one transparent trace in the second transparent-trace layer 34 partially overlap, wherein the first direction is the direction of extension of the scanning lines.

Assuming that the transparent traces 21 are located in the first transparent-trace layer 32, the transparent traces 22 are located in the second transparent-trace layer 34, and the transparent traces 23 are located in the third transparent-trace layer 36, then the overlapping part between the orthographic projection on the substrate base plate 31 of at least one transparent trace in the third transparent-trace layer 36 and the orthographic projection on the substrate base plate 31 of at least one transparent trace in the second transparent-trace layer 34 may be located at the position where they intersect, for example, the intersection point D in FIG. 2, and may also be located in the line segments extending in the first direction of them, for example, the overlapping region 2 shown in FIG. 3.

It should be noted that the orthographic projections on the substrate base plate 31 of the at least one transparent trace in the third transparent-trace layer 36 and the at least one transparent trace in the second transparent-trace layer 34 may also not overlap.

Optionally, the orthographic projections on the substrate base plate 31 of at least one transparent trace in the third transparent-trace layer 36 and at least one transparent trace in the first transparent-trace layer 32 partially overlap.

In a particular implementation, the orthographic projections on the substrate base plate 31 of the at least one transparent trace in the third transparent-trace layer 36 and the at least one transparent trace in the first transparent-trace layer 32 intersect; and/or line segments extending in a first direction of the orthographic projections on the substrate base plate 31 of the at least one transparent trace in the third transparent-trace layer 36 and the at least one transparent trace in the first transparent-trace layer 32 partially overlap, wherein the first direction is the direction of extension of the scanning lines.

Assuming that the transparent traces 21 are located in the first transparent-trace layer 32, the transparent traces 22 are located in the second transparent-trace layer 34, and the transparent traces 23 are located in the third transparent-trace layer 36, then the overlapping part between the orthographic projection on the substrate base plate 31 of at least one transparent trace in the third transparent-trace layer 36 and the orthographic projection on the substrate base plate 31 of at least one transparent trace in the first transparent-trace layer 32 may be located at the position where they intersect, for example, the intersection point E in FIG. 2, and may also be located in the line segments extending in the first direction of them, for example, the overlapping region 3 shown in FIG. 3.

It should be noted that the orthographic projections on the substrate base plate 31 of the at least one transparent trace in the third transparent-trace layer 36 and the at least one transparent trace in the first transparent-trace layer 32 may also not overlap.

In practical applications, in order to reduce the coupling capacitance, the transparent traces 22 corresponding to the (n−1)-th scanning line may be arranged in the gaps between the transparent traces 21 corresponding to the n-th scanning line, and the transparent traces 22 corresponding to the (n−1)-th scanning line and the transparent traces 21 corresponding to the n-th scanning line merely partially overlap at the projection intersection. Likewise, the transparent traces 23 corresponding to the (n−2)-th scanning line may be arranged in the gaps between the transparent traces 21 corresponding to the n-th scanning line and between the transparent traces 22 corresponding to the (n−1)-th scanning line.

Figure 5:
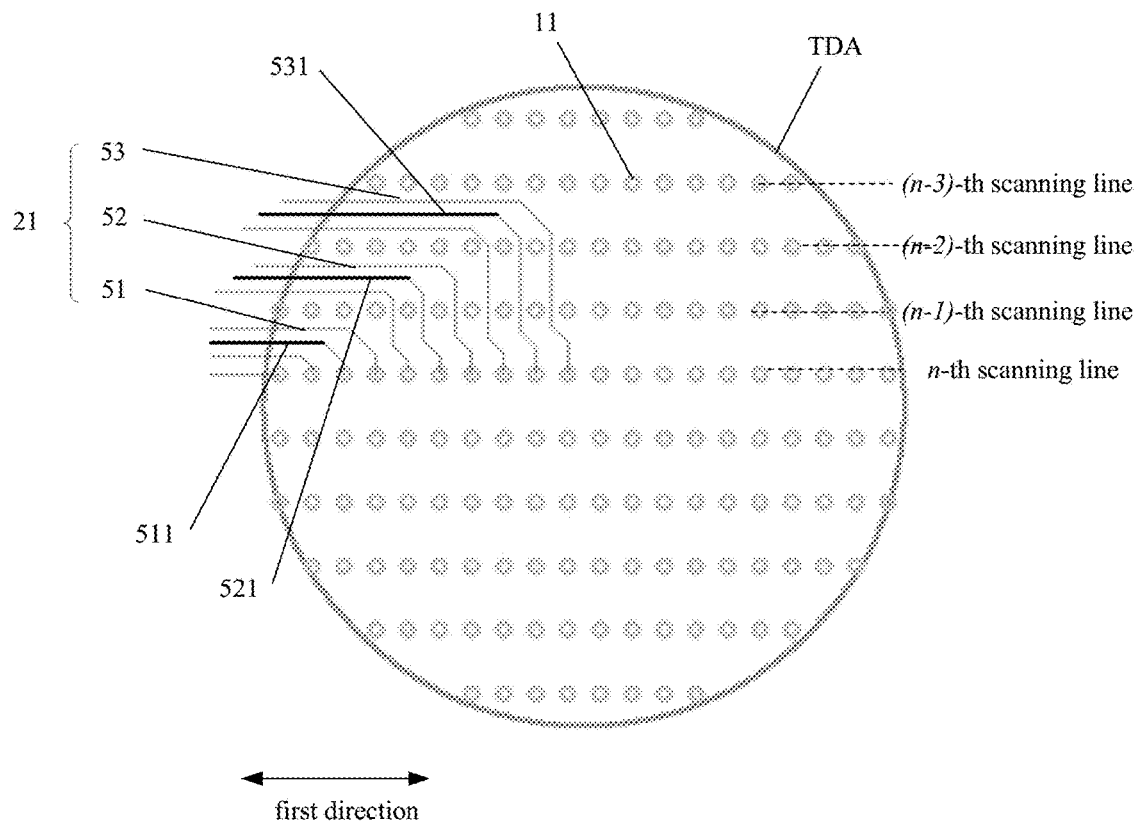
FIG. 5 shows a schematic structural diagram of a second layout of the transparent traces according to an embodiment of the present application.

In an optional implementation, referring to FIG. 5, it is assumed that the quantity of the scanning lines in the transparent displaying region is N, the direction of extension of the scanning lines is the first direction, the plane where the first light emitting regions 11 are located is the first plane, and the transparent traces 21 connected to the driving electrodes of the n-th scanning line may include a first transparent trace 51 and a second transparent trace 52.

The first transparent trace 51 comprises a first extension part 511 extending in the first direction, and the orthographic projection of the first extension part 511 on a first plane is located between the n-th scanning line and the (n−1)-th scanning line. The second transparent trace 52 comprises a second extension part 521 extending in the first direction, and the orthographic projection of the second extension part 521 on the first plane is located between the (n−1)-th scanning line and the (n−2)-th scanning line. $2 \leq n \leq N$. It should be noted that, when n=2, the orthographic projection of the second extension part 521 on the first plane is located between the 1st scanning line and the boundary of the transparent displaying region TDA (for example, the upper boundary of the transparent displaying region TDA in FIG. 5).

Optionally, the transparent traces 21 connected to the driving electrodes of the n-th scanning line may further include a third transparent trace 53, the third transparent trace 53 comprises a third extension part 531 extending in the first direction, the orthographic projection of the third extension part 531 on the first plane is located between the (n−2)-th scanning line and the (n−3)-th scanning line, wherein $3 \leq n \leq N$. It should be noted that, when n=3, the orthographic projection of the third extension part 531 on the first plane is located between the 1st scanning line and the boundary of the transparent displaying region TDA (for example, the upper boundary of the transparent displaying region TDA in FIG. 5).

When the transparent traces 21 connected to the driving electrodes of the n-th scanning line include the first transparent trace 51, the second transparent trace 52 and the third transparent trace 53, the transparent traces connected to the driving electrodes of the n-th scanning line and the transparent traces connected to the driving electrodes of the (n−1)-th scanning line are in different layers, the transparent traces connected to the driving electrodes of the (n−1)-th scanning line and the transparent traces connected to the driving electrodes of the (n−2)-th scanning line are in different layers, and, in order to further prevent short circuit between the third transparent trace 53 and the transparent traces corresponding to the (n−2)-th scanning line, the transparent traces connected to the driving electrodes of the n-th scanning line and the transparent traces connected to the driving electrodes of the (n−2)-th scanning line are also in different layers.

Referring to FIG. 5, taking the case in which the n-th scanning line is an intermediate scanning line as an example, because the transparent traces 21 connected to the driving electrodes of the intermediate scanning line have a large quantity, and thus cannot be totally placed in the scanning-line gap formed between the n-th scanning line and the (n−1)-th scanning line, the driving electrodes of the intermediate scanning line can be connected to the driving circuits outside the transparent displaying region TDA via the first transparent trace 51, the second transparent trace 52 and the third transparent trace 53. The second transparent trace 52 passes through a gap between the first light emitting regions 11 of the (n−1)-th scanning line, and is connected to the corresponding driving circuit via the second extension part 521, and the third transparent trace 53 passes through a gap between the first light emitting regions 11 of the (n−1)-th scanning line and the (n−2)-th scanning line, and is connected to the corresponding driving circuit via the third extension part 531.

Figure 6:
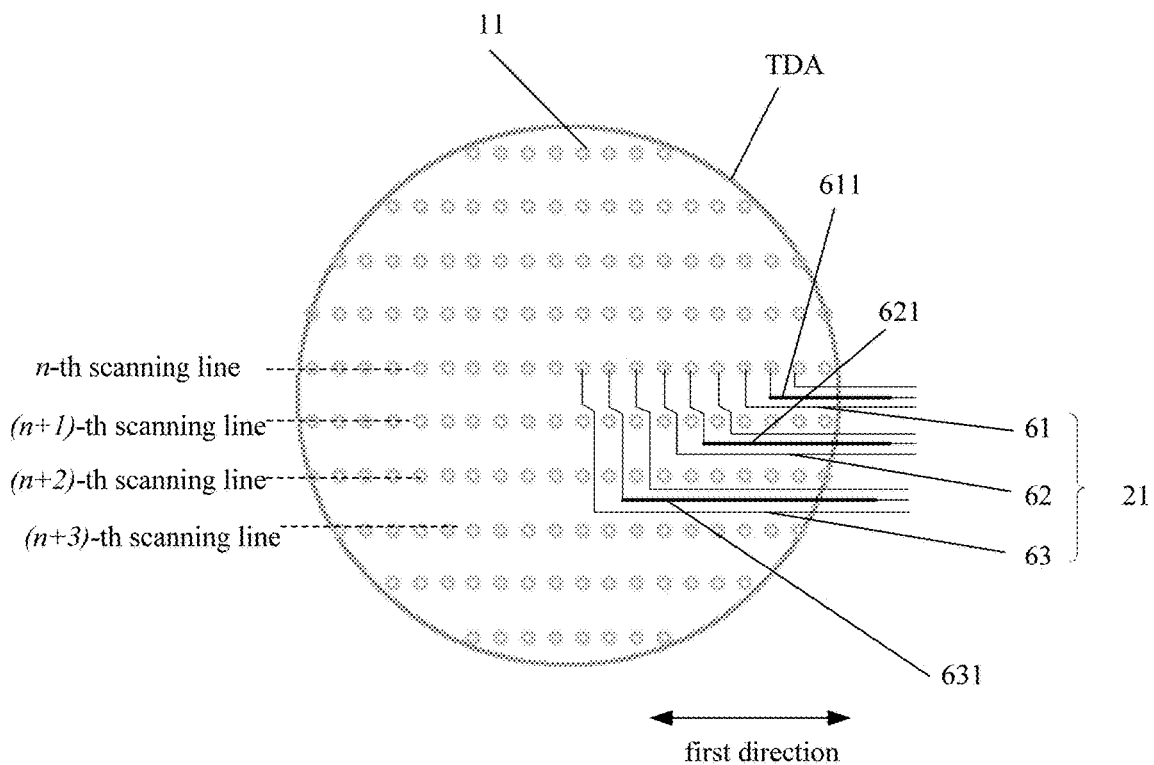
FIG. 6 shows a schematic structural diagram of a third layout of the transparent traces according to an embodiment of the present application.

In an optional implementation, referring to FIG. 6, the transparent traces 21 connected to the driving electrodes of the n-th scanning line may include a fourth transparent trace 61 and a fifth transparent trace 62.

The fourth transparent trace 61 comprises a fourth extension part 611 extending in the first direction, and the orthographic projection of the fourth extension part 611 on the first plane is located between the n-th scanning line and the (n+1)-th scanning line. The fifth transparent trace 62 comprises a fifth extension part 621 extending in the first direction, and the orthographic projection of the fifth extension part 621 on the first plane is located between the (n+1)-th scanning line and the (n+2)-th scanning line. The first direction is the direction of extension of the scanning lines, the first plane is the plane where the first light emitting regions 11 are located, and 1≤n≤N−1. It should be noted that, when n=N−1, the orthographic projection of the fifth extension part 621 on the first plane is located between the n-th scanning line and the boundary of the transparent displaying region TDA (for example, the lower boundary of the transparent displaying region TDA in FIG. 6).

Optionally, the transparent traces 21 connected to the driving electrodes of the n-th scanning line may further include a sixth transparent trace 63, the sixth transparent trace 63 comprises a sixth extension part 631 extending in the first direction, and the orthographic projection of the sixth extension part 631 on the first plane is located between the (n+2)-th scanning line and the (n+3)-th scanning line, wherein 1≤n≤N−2. It should be noted that, when n=N−2, the orthographic projection of the sixth extension part 631 on the first plane is located between the n-th scanning line and the boundary of the transparent displaying region TDA (for example, the lower boundary of the transparent displaying region TDA in FIG. 6).

When the transparent traces 21 connected to the driving electrodes of the n-th scanning line include the fourth transparent trace 61, the fifth transparent trace 62 and the sixth transparent trace 63, the transparent traces connected to the driving electrodes of the n-th scanning line and the transparent traces connected to the driving electrodes of the (n+1)-th scanning line are in different layers, the transparent traces connected to the driving electrodes of the (n+1)-th scanning line and the transparent traces connected to the driving electrodes of the (n+2)-th scanning line are in different layers, and, in order to prevent short circuit between the sixth transparent trace 63 and the transparent traces corresponding to the (n+2)-th scanning line, the transparent traces connected to the driving electrodes of the n-th scanning line and the transparent traces connected to the driving electrodes of the (n+2)-th scanning line are also in different layers.

Referring to FIG. 6, taking the case in which the n-th scanning line is an intermediate scanning line as an example, because the transparent traces 21 connected to the driving electrodes of the intermediate scanning line have a large quantity, and thus cannot be totally placed in the scanning-line gap formed between the n-th scanning line and the (n+1)-th scanning line, the driving electrodes of the intermediate scanning line can be connected to the driving circuits outside the transparent displaying region TDA via the fourth transparent trace 61, the fifth transparent trace 62 and the sixth transparent trace 63. The fifth transparent trace 62 passes through a gap between the first light emitting regions 11 of the (n+1)-th scanning line, and is connected to the corresponding driving circuit via the fifth extension part 621, and the sixth transparent trace 63 passes through a gap between the first light emitting regions 11 of the (n+1)-th scanning line and the (n+2)-th scanning line, and is connected to the corresponding driving circuit via the sixth extension part 631.

Figure 7:
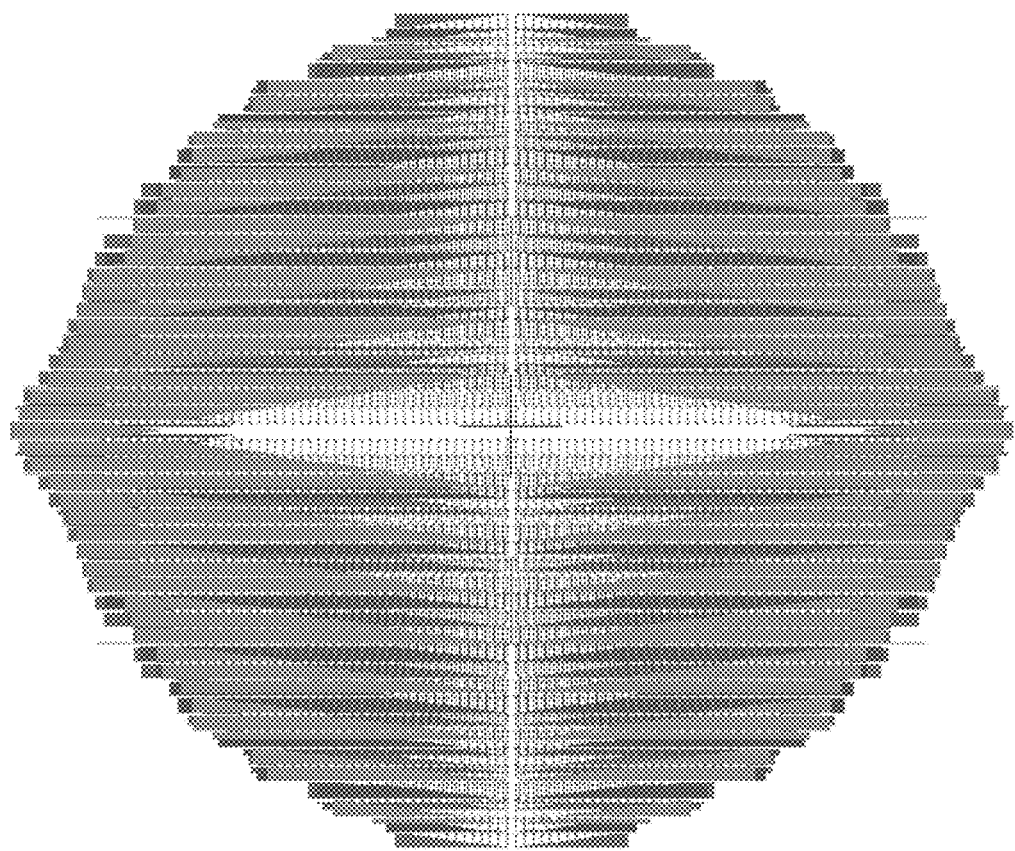
FIG. 7 shows an overall schematic structural diagram of the transparent traces of the transparent displaying region according to an embodiment of the present application.

Referring to FIG. 7, FIG. 7 shows a schematic diagram of the overall design of the transparent traces in the transparent displaying region according to the present embodiment.

Figure 8:
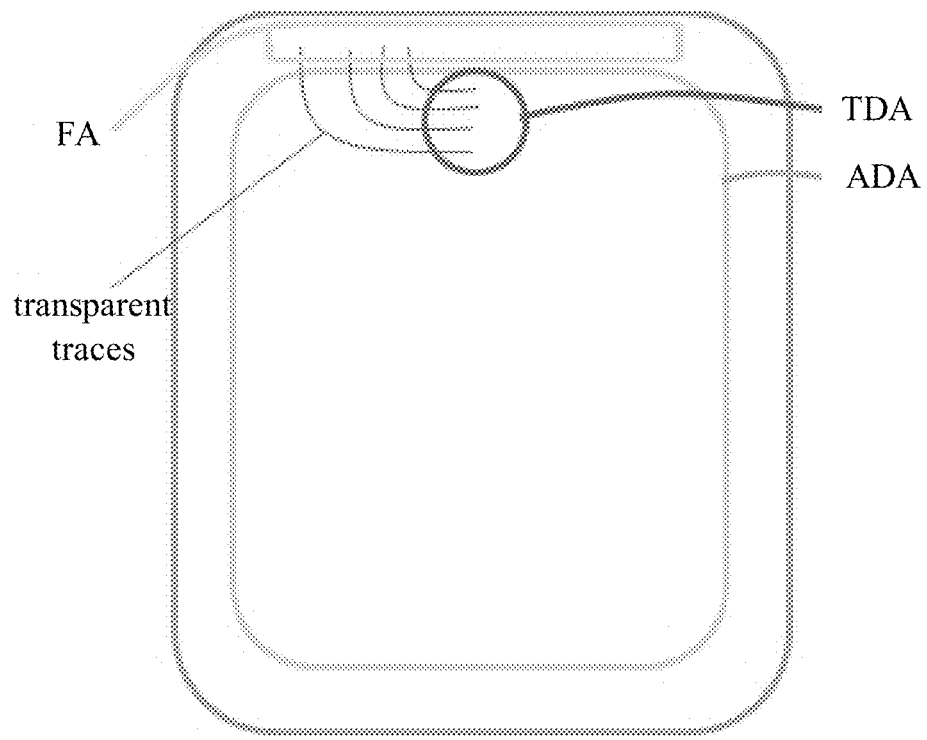
FIG. 8 shows a schematic planar structural diagram of another displaying base plate according to an embodiment of the present application.

In an optional implementation, referring to FIG. 8, the displaying base plate may further comprise a boundary-frame region FA provided at the periphery of the transparent displaying region TDA and of the effective displaying region ADA, and the driving circuits for driving the first light emitting regions 11 to emit light are provided at the boundary-frame region FA. In other words, the driving electrodes of the first light emitting regions 11 are connected to the driving circuits provided at the boundary-frame region FA via the transparent traces.

In a particular implementation, the driving circuits for driving the first light emitting regions 11 to emit light may be arranged at the boundary-frame region closer to the transparent displaying region TDA. For example, when the transparent displaying region TDA is arranged closer to the upper boundary frame, as shown in FIG. 8, the driving circuits for driving the first light emitting regions 11 to emit light may be arranged at the upper-boundary-frame region.

In an optional implementation, the effective displaying region ADA comprises a plurality of second light emitting regions 12, and the distribution density of the first light emitting regions 11 may be less than or equal to the distribution density of the second light emitting regions 12. The driving circuits connected to the driving electrodes of the first light emitting regions 11 may be arranged at a region outside the transparent displaying region TDA of the displaying base plate.

When the distribution density of the first light emitting regions 11 and the distribution density of the second light emitting regions 12 are equal, the area of the first light emitting regions 11 may be less than or equal to the area of the second light emitting regions 12, which can obtain better effects of displaying and shooting.

In a particular implementation, the transparent displaying region TDA may comprise a plurality of first pixel units, each of the first pixel units comprises a plurality of first sub-pixel units, each of the first sub-pixel units comprises a first light emitting region 11 and a light transmission region, and the distribution density of the first light emitting regions 11 may be equal to the distribution density of the second light emitting regions 12 in the effective displaying region ADA.

The effective displaying region ADA may comprise a plurality of second pixel units, each of the second pixel units comprises a plurality of second sub-pixel units, each of the second sub-pixel units comprises a second light emitting region 12 and a driving circuit for driving each of the second light emitting regions 12 to emit light.

Each of the first sub-pixel units of the transparent displaying region TDA comprises a first light emitting region 11 and a light transmission region (not comprising the driving circuit), and the density of the first light emitting regions 11 may be equal to the density of the second light emitting regions 12 in the effective displaying region ADA. Therefore, the transparent displaying region TDA cannot only display an image having a resolution the same as that of the effective displaying region ADA, but can also enable the light ray of the shot object to transmit the transparent displaying region TDA and in turn reach the under-screen camera, to realize the effect of full-screen displaying.

Because the distribution densities of the first light emitting regions in the transparent displaying region and the second light emitting regions in the effective displaying region are equal, the differences in the brightnesses and the resolutions of the transparent displaying region and the effective displaying region can be reduced, which greatly solves the problem of lower brightness and resolution of the transparent displaying region, and realizes the effect of a more uniform full-screen displaying.

When the area of the first light emitting regions 11 is equal to the area of the second light emitting regions 12, that means that the aperture area of each of the first sub-pixel units in the transparent displaying region TDA and the aperture area of each of the second sub-pixel units in the effective displaying region ADA are equal, which can make the emitted-light brightnesses of the transparent displaying region and the effective displaying region equal, thereby eliminating the differences in the brightnesses and the resolutions of the transparent displaying region and the effective displaying region, and further realizing the effect of a more uniform full-screen visual displaying.

When the distribution density of the first light emitting regions 11 is less than the distribution density of the second light emitting regions 12, the area of the first light emitting regions 11 may be greater than or equal to the area of the second light emitting regions 12, which can obtain better effects of displaying and shooting.

In an optional implementation, the width of the transparent traces may be greater than or equal to 0.2 μm, and less than or equal to 20 μm. Taking into consideration the trace room and the restriction by the process conditions, the width of the transparent traces may, for example, be 2 μm. The inventor has found by experimentation that the yield of the transparent traces of the width of 2 μm is higher.

In an optional implementation, the spacing between two neighboring transparent traces provided in the same one layer may be greater than or equal to 0.2 μm, and less than or equal to 20 μm. Taking into consideration the trace room and the restriction by the process conditions, the spacing between two neighboring transparent traces provided in the same one layer may, for example, be 2 μm.

It should be noted that the positions of the transparent displaying regions in the drawings for describing the solutions of the present embodiment are merely illustrative, and the present embodiment is not limited to the positions. The shape of the outer contour of the transparent displaying region is merely intended for illustration, comprehension and description, is not limited to a circle, and may also be a rectangle, an ellipse, a polygon or another shape. The transparent traces are not limited to two layers or three layers, and may also be more layers.

Another embodiment of the present application further provides a displaying device, wherein the displaying device comprises a camera and the displaying base plate according to any one of the above embodiments, and an orthographic projection of the camera on the displaying base plate is located within the transparent displaying region.

It should be noted that the displaying device according to the present embodiment may be any products or components that have the function of 2D or 3D displaying such as a display panel, an electronic paper, a mobile phone, a tablet personal computer, a TV set, a notebook computer, a digital photo frame and a navigator.

The displaying device according to the present embodiment comprises a camera and the displaying base plate according to any one of the above embodiments.

The displaying base plate comprises a transparent displaying region and an effective displaying region, the transparent displaying region comprises a plurality of scanning lines, each of the scanning lines comprises one or more first light emitting regions, a driving electrode of each of the first light emitting regions is connected to a corresponding driving circuit via a transparent trace, the transparent traces connected to the driving electrodes of a same one instance of the scanning lines are located in a same one layer, the plurality of scanning lines include at least a pair of neighboring first scanning line and second scanning line, and the transparent traces connected to the driving electrodes of the first scanning line and the transparent traces connected to the driving electrodes of the second scanning line are located in different layers. The present application, by providing the transparent traces connected to the driving electrodes of the first scanning line and the transparent traces connected to the driving electrodes of the second scanning line in the different layers, can enlarge the wiring room of the transparent traces connected to the driving electrodes of the first scanning line and the transparent traces connected to the driving electrodes of the second scanning line, thereby realizing placing transparent traces of an enormous quantity into a limited space.

The "one embodiment", "an embodiment" or "one or more embodiments" as used herein means that particular features, structures or characteristics described with reference to an embodiment are included in at least one embodiment of the present disclosure. Moreover, it should be noted that here an example using the wording "in an embodiment" does not necessarily refer to the same one embodiment.

The description provided herein describes many concrete details. However, it can be understood that the embodiments of the present disclosure may be implemented without those concrete details. In some of the embodiments, well-known processes, structures and techniques are not described in detail, so as not to affect the understanding of the description.

In the claims, any reference signs between parentheses should not be construed as limiting the claims. The word "comprise" does not exclude elements or steps that are not listed in the claims. The word "a" or "an" preceding an element does not exclude the existing of a plurality of such elements. The present disclosure may be implemented by means of hardware comprising several different elements and by means of a properly programmed computer. In unit claims that list several devices, some of those devices may be embodied by the same item of hardware. The words first, second, third and so on do not denote any order. Those words may be interpreted as names.

Finally, it should be noted that the above embodiments are merely intended to explain the technical solutions of the present disclosure, and not to limit them. Although the present disclosure is explained in detail by referring to the above embodiments, a person skilled in the art should understand that he can still modify the technical solutions set forth by the above embodiments, or make equivalent substitutions to part of the technical features of them. However, those modifications or substitutions do not make the essence of the corresponding technical solutions depart from the spirit and scope of the technical solutions of the embodiments of the present disclosure.

The invention claimed is:

1. A displaying base plate, wherein the displaying base plate comprises a transparent displaying region and an effective displaying region, the transparent displaying region comprises a plurality of scanning lines, each of the scanning lines comprises one or more first light emitting regions, a driving electrode of each of the first light emitting regions is connected to a corresponding driving circuit via a transparent trace, the transparent traces connected to the driving electrodes of a same one instance of the scanning lines are located in a same one layer, the plurality of scanning lines include at least a pair of neighboring first scanning line and second scanning line, and the transparent traces connected to the driving electrodes of the first scanning line and the transparent traces connected to the driving electrodes of the second scanning line are located in different layers;

wherein a quantity of the scanning lines in the transparent displaying region is N, the transparent traces connected to the driving electrodes of an n-th scanning line include a first transparent trace and a second transparent trace, the first transparent trace comprises a first extension part extending in a first direction, an orthographic projection of the first extension part on a first plane is located between the n-th scanning line and an (n−1)-th scanning line, the second transparent trace comprises a second extension part extending in the first direction, and an orthographic projection of the second extension part on the first plane is located between the (n−1)-th scanning line and an (n−2)-th scanning line;

wherein the first direction is a direction of extension of the scanning lines, the first plane is a plane where all of the first light emitting regions are located, and $2 \leq n \leq N$.

2. The displaying base plate according to claim 1, wherein the transparent traces connected to the driving electrodes of any two neighboring instances of the scanning lines are located in different layers.

3. The displaying base plate according to claim 1, wherein the displaying base plate comprises: a substrate base plate, and a first transparent-trace layer, a first insulating layer and a second transparent-trace layer that are provided in stack on one side of the substrate base plate, the first transparent-trace layer is provided closer to the substrate base plate, and orthographic projections on the substrate base plate of at least one transparent trace in the first transparent-trace layer and at least one transparent trace in the second transparent-trace layer partially overlap.

4. The displaying base plate according to claim 3, wherein the orthographic projections on the substrate base plate of the at least one transparent trace in the first transparent-trace layer and the at least one transparent trace in the second transparent-trace layer intersect; and/or line segments extending in a first direction of the orthographic projections on the substrate base plate of the at least one transparent trace in the first transparent-trace layer and the at least one transparent trace in the second transparent-trace layer partially overlap, wherein the first direction is a direction of extension of the scanning lines.

5. The displaying base plate according to claim 3, wherein the displaying base plate further comprises: a second insulating layer and a third transparent-trace layer that are provided in stack on one side of the second transparent-trace layer that is further away from the substrate base plate, the second insulating layer is provided closer to the second transparent-trace layer, and orthographic projections on the substrate base plate of at least one transparent trace in the third transparent-trace layer and at least one transparent trace in the second transparent-trace layer partially overlap.

6. The displaying base plate according to claim 5, wherein the orthographic projections on the substrate base plate of the at least one transparent trace in the third transparent-trace layer and the at least one transparent trace in the second transparent-trace layer intersect; and/or line segments extending in a first direction of the orthographic projections on the substrate base plate of the at least one transparent trace in the third transparent-trace layer and the at least one transparent trace in the second transparent-trace layer partially overlap, wherein the first direction is a direction of extension of the scanning lines.

7. The displaying base plate according to claim 5, wherein orthographic projections on the substrate base plate of at least one transparent trace in the third transparent-trace layer and at least one transparent trace in the first transparent-trace layer partially overlap.

8. The displaying base plate according to claim 7, wherein the orthographic projections on the substrate base plate of the at least one transparent trace in the third transparent-trace layer and the at least one transparent trace in the first transparent-trace layer intersect; and/or line segments extending in a first direction of the orthographic projections on the substrate base plate of the at least one transparent trace in the third transparent-trace layer and the at least one transparent trace in the first transparent-trace layer partially overlap, wherein the first direction is a direction of extension of the scanning lines.

9. The displaying base plate according to claim 1, wherein the transparent traces connected to the driving electrodes of the n-th scanning line further include a third transparent trace, the third transparent trace comprises a third extension part extending in the first direction, and an orthographic projection of the third extension part on the first plane is located between the (n−2)-th scanning line and an (n−3)-th scanning line, wherein $3 \leq n \leq N$.

10. The displaying base plate according to claim 9, wherein the transparent traces connected to the driving electrodes of the n-th scanning line and the transparent traces connected to the driving electrodes of the (n−2)-th scanning line are located in different layers.

11. A displaying base plate, wherein the displaying base plate comprises a transparent displaying region and an effective displaying region, the transparent displaying region comprises a plurality of scanning lines, each of the scanning lines comprises one or more first light emitting regions, a driving electrode of each of the first light emitting regions is connected to a corresponding driving circuit via a transparent trace, the transparent traces connected to the driving electrodes of a same one instance of the scanning lines are located in a same one layer, the plurality of scanning lines include at least a pair of neighboring first scanning line and second scanning line, and the transparent traces connected to the driving electrodes of the first scanning line and the transparent traces connected to the driving electrodes of the second scanning line are located in different layers;

wherein a quantity of the scanning lines in the transparent displaying region is N, the transparent traces connected to the driving electrodes of an n-th scanning line include a fourth transparent trace and a fifth transparent trace, the fourth transparent trace comprises a fourth extension part extending in a first direction, an orthographic projection of the fourth extension part on a first plane is located between the n-th scanning line and an (n+1)-th scanning line, the fifth transparent trace comprises a fifth extension part extending in the first direction, and an orthographic projection of the fifth extension part on the first plane is located between the (n+1)-th scanning line and an (n+2)-th scanning line;

wherein the first direction is a direction of extension of the scanning lines, the first plane is a plane where all of the first light emitting regions are located, and 1≤n≤N−1.

12. The displaying base plate according to claim 11, wherein the transparent traces connected to the driving electrodes of the n-th scanning line further include a sixth transparent trace, the sixth transparent trace comprises a sixth extension part extending in the first direction, and an orthographic projection of the sixth extension part on the first plane is located between the (n+2)-th scanning line and an (n+3)-th scanning line, wherein 1≤n≤N−2.

13. The displaying base plate according to claim 12, wherein the transparent traces connected to the driving electrodes of the n-th scanning line and the transparent traces connected to the driving electrodes of the (n+2)-th scanning line are located in different layers.

14. The displaying base plate according to claim 1, wherein the displaying base plate further comprises a boundary-frame region provided at a periphery of the transparent displaying region and of the effective displaying region, and the driving circuits are provided at the boundary-frame region.

15. The displaying base plate according to claim 1, wherein the effective displaying region comprises a plurality of second light emitting regions, and a distribution density of the first light emitting regions and a distribution density of the second light emitting regions are equal.

16. The displaying base plate according to claim 15, wherein an area of the first light emitting regions is less than or equal to an area of the second light emitting regions.

17. The displaying base plate according to claim 1, wherein the effective displaying region comprises a plurality of second light emitting regions, and a distribution density of the first light emitting regions is less than a distribution density of the second light emitting regions.

18. The displaying base plate according to claim 17, wherein an area of the first light emitting regions is less than or equal to an area of the second light emitting regions.

19. A displaying device, wherein the displaying device comprises a camera and the displaying base plate according to claim 1, and an orthographic projection of the camera on the displaying base plate is located within the transparent displaying region.

* * * * *